US006720859B2

(12) United States Patent
Mazzochette

(10) Patent No.: US 6,720,859 B2
(45) Date of Patent: Apr. 13, 2004

(54) TEMPERATURE COMPENSATING DEVICE WITH EMBEDDED COLUMNAR THERMISTORS

(75) Inventor: Joseph Mazzochette, Cherry Hill, NJ (US)

(73) Assignee: Lamina Ceramics, Inc., Westampton, NJ (US)

( * ) Notice: Subject to any disclaimer, the term of this patent is extended or adjusted under 35 U.S.C. 154(b) by 0 days.

(21) Appl. No.: 10/043,733

(22) Filed: Jan. 10, 2002

(65) Prior Publication Data

US 2003/0128097 A1 Jul. 10, 2003

(51) Int. Cl.[7] .................................................. H01L 7/10

(52) U.S. Cl. ..................... 338/22 R; 338/260; 338/320; 338/310; 338/311

(58) Field of Search .......................... 338/22 R, 22 SD, 338/319, 320, 311, 312, 252, 253, 239, 313, 195, 25, 28, 260, 310

(56) References Cited

U.S. PATENT DOCUMENTS

| | | | | | |
|---|---|---|---|---|---|
| 4,401,885 | A | * | 8/1983 | Ishii et al. | 338/22 R |
| 4,937,435 | A | * | 6/1990 | Goss et al. | 219/528 |
| 5,164,699 | A | * | 11/1992 | Smith et al. | 338/310 |
| 5,332,981 | A | * | 7/1994 | Mazzochette et al. | 333/81 R |
| 5,414,403 | A | * | 5/1995 | Greuter et al. | 338/22 R |
| 5,493,266 | A | * | 2/1996 | Sasaki et al. | 338/22 R |
| 6,284,080 | B1 | * | 9/2001 | Haq et al. | 156/89.16 |
| 6,311,390 | B1 | * | 11/2001 | Abe et al. | 29/612 |
| 6,362,723 | B1 | * | 3/2002 | Kawase | 338/22 R |

FOREIGN PATENT DOCUMENTS

| | | | | |
|---|---|---|---|---|
| JP | 60-250582 | * | 12/1985 | |
| JP | 61-27082 | * | 2/1986 | |
| JP | 1-66906 | * | 3/1989 | 338/22 SD |
| JP | 4-320301 | * | 11/1992 | 338/22 SD |

* cited by examiner

*Primary Examiner*—Karl D. Easthom
(74) *Attorney, Agent, or Firm*—Lowenstein Sandler PC

(57) ABSTRACT

A temperature compensating device comprises one or more columnar thermistors embedded within a substrate. Because the thermistors are substantially covered by the substrate, they are less susceptible to changes in air temperature and to temperature gradients. Moreover, within the substrate the thermistors can be made thicker and smaller in lateral area, permitting more compact, less expensive devices that exhibit improved high frequency performance. The devices can advantageously be fabricated using the low temperature co-fired ceramic (LTCC) process.

28 Claims, 4 Drawing Sheets

99
101
103
100
110A
110B
104
105
106
109A
109B
102

TEMPERATURE COMPENSATING DEVICE WITH EMBEDDED COLUMNAR THERMISTORS

FIELD OF THE INVENTION

This invention relates to temperature compensating devices for compensating the effect of temperature changes in an electrical or electronic circuit. In particular, it relates to a temperature compensating device using embedded columnar thermistors for enhanced performance.

BACKGROUND OF THE INVENTION

Temperature compensating devices are important components in a wide variety of electrical and electronic circuits such as high frequency communication circuits. Communication circuits are typically constructed using components, such as semiconductor devices, whose properties change with temperature. For example, solid state amplifiers are made using semiconductor components, and the current carrying ability of these components decreases with increasing temperature, reducing the gain of the amplifier. In the absence of compensation, such temperature-induced changes can deteriorate the performance of the circuit.

One method for compensating temperature-induced changes in a communication circuit is to cascade the circuit with a temperature compensating device whose pertinent characteristics vary oppositely with temperature. For example, an amplifier can be cascaded with a compensating device that increases in gain with increasing temperature. The cascaded combination minimizes gain variation with temperature.

U.S. Pat. No. 5,332,981 issued to the present applicant and John Steponick on Jul. 26, 1994, and is incorporated herein by reference. The '981 patent, which is entitled "Temperature Variable Attenuator," describes a passive temperature compensating device using at least two different thermistors which are deposited as films on a substrate. The temperature coefficients of the thermistors are different and are selected so that the attenuator changes at a controlled rate with temperature while the impedance of the attenuator remains substantially constant.

Difficulties with the '981 device arise because the thermistors are formed as thin, relatively large area films on the surface of a substrate. The films are unduly susceptible to changes in air temperature. Moreover, there can be substantial temperature gradients between the film-air interface and the film/substrate interface. As one consequence, forced air cooling can vary the thermistor temperature and produce unwanted gain ripple. Another difficulty is that the relatively large area of the film requires a relatively large substrate. This increases cost, consumes board space, and degrades high frequency performance. Accordingly there is a need for improved temperature compensating devices.

SUMMARY OF THE INVENTION

In accordance with the invention, a temperature compensating device comprises one or more columnar thermistors embedded within a substrate. Because the thermistors are substantially covered by the substrate, they are less susceptible to changes in air temperature and to temperature gradients. Moreover, within the substrate the thermistors can be made thicker and smaller in lateral area, permitting more compact, less expensive devices that exhibit improved high frequency performance. The devices can advantageously be fabricated using the low temperature co-fired ceramic (LTCC) process.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that the drawings are for illustrating the concepts of the invention and are not to scale.

DETAILED DESCRIPTION

Figure 1:
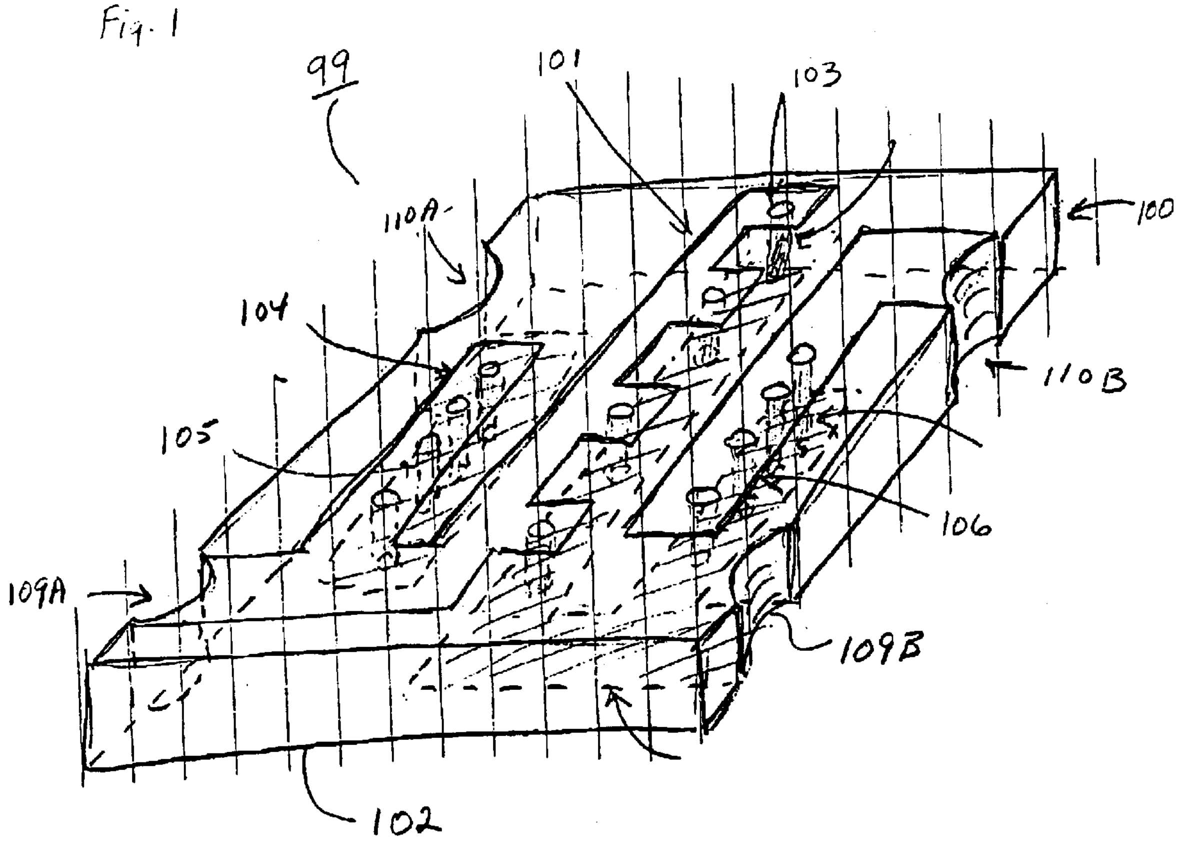
FIG. 1 is a perspective view of an exemplary temperature compensating device.

Referring to the drawings, FIG. 1 illustrates a temperature compensating device 99 comprising a substrate 100 having a pair of major surfaces 101, 102 (preferably parallel) and a plurality of thermistors 104, 105, 106 connected in a temperature compensating circuit. At least one thermistor comprises one or more columnar bodies 103 of thermistor material, i.e. the bodies extend substantially in the direction between the major surfaces. The columnar bodies 103 (hereinafter "columns") are conveniently uniform in cross sectional area. However the area can vary along the longitudinal direction without serious disadvantage. The columns 103 can be interconnected by metallization patterns 107A, 107B, 108A, 108B on the major surfaces. The resistance of each thermistor, at a given temperature, depends directly on the column length, inversely on the column area and inversely on the number of columns interconnected by the metallization.

Figure 2A:
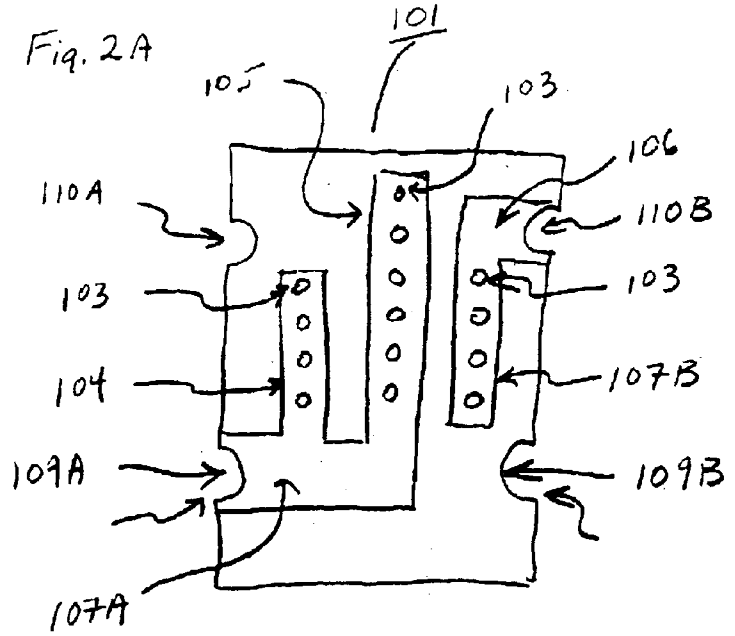
FIGS. 2A, 2B and 2C are simplified top, side and bottom views of the device of FIG. 1.
Figure 2B:
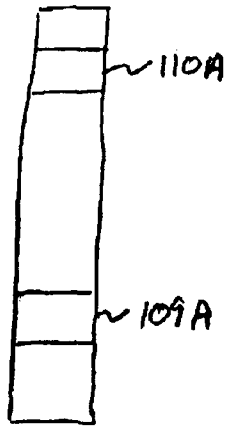
Figure 2C:
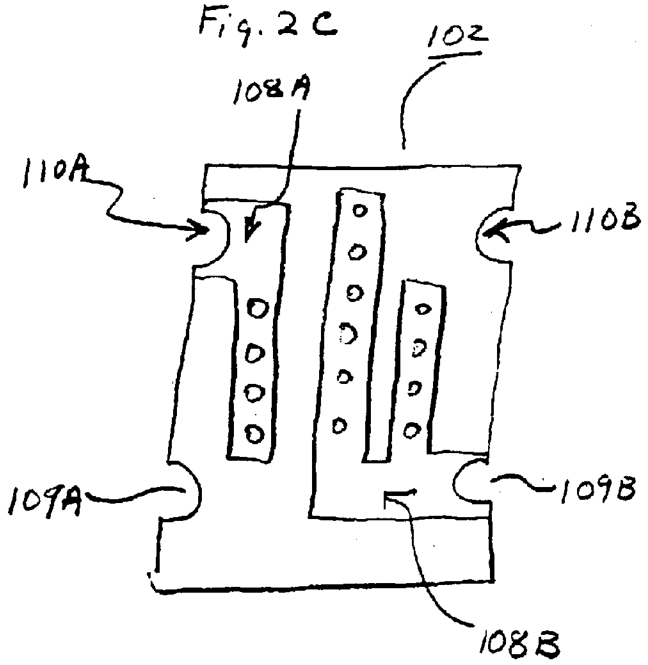
Figure 3:
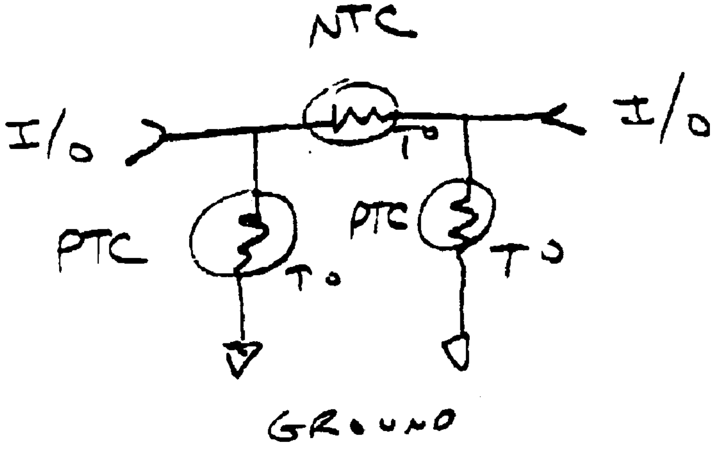
FIG. 3 is a schematic circuit diagram of the device of FIG. 1.

FIGS. 2A, 2B and 2C are top, side and bottom views respectively of the temperature compensating device of FIG. 1 having major surfaces 101 (top) and 102 (bottom). Each column 103 of thermistor material extends substantially in the direction between the major surfaces. Each column 103 has ends which are small compared to the lateral area embedded within the substrate. A plurality of thermistors 104, 105 and 106 are defined by patterns of metallization interconnecting sets of columns 103 on the major surfaces. Conveniently the metallization contacts the column ends near the major surfaces. Specifically, metallization patterns 107A, 107B on surface 101 and patterns 108A, 108B on surface 102 interconnect the ends of four columns 103 into thermistor 104, six columns into thermistor 105 and four columns into thermistor 106. Conveniently, notches 109A, 109B mark input/output contacts. Notches 110A, 110B mark ground contacts. In addition to connecting the columns, the metallization patterns 107A, 107B, 108A, 108B also define the interconnected circuit configuration among the thermistors 104, 105, 106. It can be seen, for example, that the metallization patterns of FIGS. 2A, 2B interconnect the thermistors 104, 105, 106 into the Pi configuration temperature compensating circuit schematically shown in FIG. 3.

The operation of this and other suitable temperature compensating circuits is described in the aforementioned U.S. Pat. No. 5,332,981 and in *Reference Data for Engineers: Radio, Electronics, and Communications*, Seventh Edition, Howard W. Sams & Co., Indianapolis, Ind., 1985, page: 11–4 et seq.

As compared with prior temperature compensating devices using thin film thermistors, the columnar thermistor device of FIG. 1 reduces air temperature modulation and thermal gradient problems. No significant areas of the thermistor columns are exposed. Moreover the device can be made smaller in lateral area by utilizing the volume within the substrate.

Figure 4:
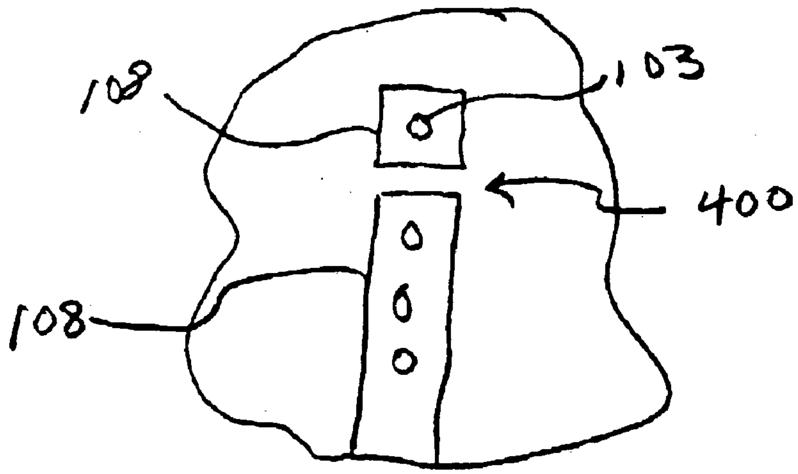
FIG. 4 illustrates trimming of a thermistor in the FIG. 1 device.

An additional advantage is that the resistance values of individual thermistors can be easily trimmed. Since the thermistors are columns 103 connected in parallel, the ohmic value of each thermistor can be increased by disconnecting columns from the circuit. FIG. 4 illustrates a column 103 disconnected by a cut 400 through the metallization 108. The metallization can be cut, for example, by laser, abrasion or chemical etching.

The temperature compensating device of FIG. 1 is advantageously fabricated using Low Temperature Co-fired Ceramic (LTCC) processing. Holes are punched in unfired ("green") ceramic sheets. The thermistor columns 103 can be formed in the holes. The columns can occupy a single layer, as illustrated in FIG. 1, or be formed in multiple stacked layers. Advantageously the columns are created by filling prepunched holes with a sinterable thermistor material, as in the form of glass-based frits. The connecting electrodes are then formed on the appropriate surfaces as by printing with conductive ink, and the green sheets are stacked and fired.

The thermistor material can be negative coefficient of temperature material ("NTC" material) or positive coefficient of temperature ("PTC") material. NTC thermistors are typically based on oxides such as MgO or barium titanate; PTC thermistors are typically platinum-based. The ohmic value of each thermistor is determined by the number of columns (n), the diameter of each column (d), the length of the column (l) and the resitivity of the materials ρ. Specifically, the resistance $R=\rho l/\pi n\ (d/2)^2$. It will be appreciated that the metallization pattern can be configured to form any one of a variety of temperature compensating circuits.

Figure 5:
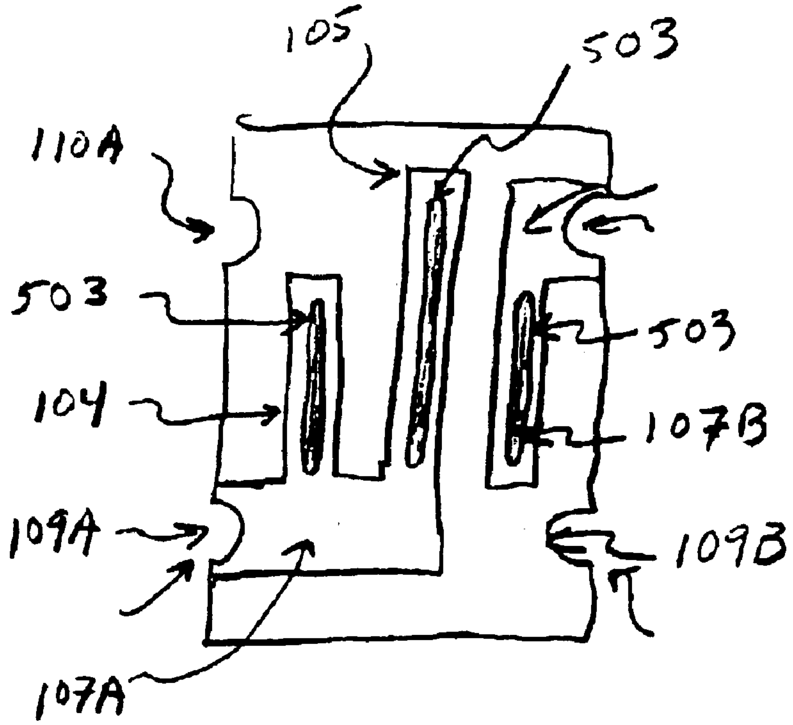
FIG. 5 shows an alternative embodiment of a temperature compensating device.

FIG. 5 is a simplified view of an alternative embodiment using laterally extending columnar thermistors 503. In the embodiment of FIG. 1 the maximum dimension of each column 103 extends between the major surfaces. The embodiment of FIG. 5 is substantially similar except that the maximum dimension of each columnar body 503 extends laterally in a direction parallel to a major surface. This embodiment can be fabricated in substantially the same way as the embodiment of FIG. 1, but has the advantage of compactly providing lower levels of resistance.

Figure 6:
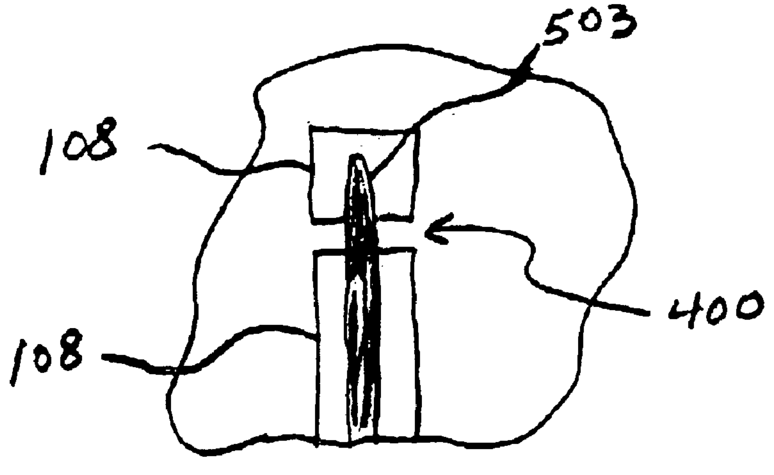
FIG. 6 illustrates trimming of a thermistor in the FIG. 5 device.

FIG. 6 illustrates how a laterally extending columnar thermistor 503A can be trimmed by a cut in the metallization.

The invention can now be understood more clearly by consideration of the following specific embodiment.

EXAMPLE

An exemplary device according to FIG. 1 can be fabricated using the DuPont LTCC system 951 described in the DuPont material data sheet titled 951 Low-Temperature Cofire Dielectric Tape. The tape is a mixture of organic binder and glass. When fired, the tape forms the ceramic substrate for the circuit. Individual circuits are formed on a large wafer and then singulated after processing. Prior to firing, holes or vias are punched in the tape. The holes correspond to the location of the thermistor columns and conductor connections between tape layers. After punching, the vias are filled with either DuPont 6141 silver conductor to form electrically conductive connections, or with Electroscience Laboratories NTC 2112 thermistor material to create thermistor columns. Printing is accomplished using a squeegee printer and a metal stencil. After printing the solvents in the material are dried at 70° C. for 30 minutes. Electrically conductive interconnections are then made by screen printing a metal ink such as DuPont 6142 silver. All conductor prints must be dried. After the via holes are filled and conductive traces are printed and dried, the separate tape layers are aligned, stacked, and tacked together using a high temperature (200° C.), 3 mm diameter tool. The stacked tapes are then laminated at 3000–4000 PSI at 70° C. After lamination the assembly is heated to ~400° C. to burn off the organic materials in the tape layers. After burn-off, the assembly is heated to 850° C. to sinter the glass. As the assembly exits the furnace and cools, the circuit forms a solid ceramic mass. Individual circuits are separated from the wafer by dicing.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. An attenuator device having at least two ports, the attenuator used to compensate the effect of temperature changes in an electronic circuit comprising:

a substrate having a pair of major surfaces;

a plurality of thermistors embedded within the substrate, at least one of the thermistors comprising a columnar body of thermistor material extending substantially in the direction between the major surfaces; and electrodes on the major surfaces interconnecting the thermistors in groups, the groups forming the components of an attenuator in a temperature compensating circuit, wherein one or more of the electrodes are trimmable to set the value of at least one of the components;

at least three terminal forming the at least two ports, wherein one of the terminals comprises an input electrode connected to one group of columnar thermistors, one of the terminals comprises an output electrode connected to at least one different group of columnar thermistors, and one of the terminals comprises a common terminal.

2. The device of claim 1 wherein the substrate comprises a low temperature co-fired (LTCC) ceramic substrate.

3. The device of claim 1 wherein at least one of the thermistors comprises a plurality of parallel-interconnected columnar bodies of thermistor material, each body extending substantially in the direction between the major surfaces.

4. The device of claim 1 wherein the columnar body of thermistor material has opposite ends contacted with the electrodes at the respective major surfaces of the substrate and a lateral area embedded within the substrate, the embedded lateral area larger than the areas of either of the ends.

5. The device of claim 1 wherein each of a plurality of thermistors comprise a columnar body of thermistor material extending substantially in the direction between the major surfaces.

6. The device of claim 1 wherein each component of the attenuator device comprises a plurality of parallel or series interconnected columnar bodies of thermistor material.

7. The device of claim 1 wherein the columnar body has its maximum dimension extending between the major surfaces.

8. The device of claim 1 wherein the columnar body has its maximum dimension extending parallel to a major surface.

9. The device of claim 1 wherein the attenuator circuit topology is selected from the group of circuit topologies consisting of π, L, bridged T, and T.

10. The device of claim 1 wherein the electrodes comprise metallization patterns.

11. The device of claim 1 wherein the electronic circuit comprises an amplifier and the temperature coefficients of the groups of thermistors compensate for temperature induced gain changes at the amplifier.

12. The device of claim 1 wherein the electronic circuit comprises a passive electronic circuit and the temperature coefficients of the groups of thermistors compensate for changes in the passive circuit's loss with temperature.

13. A low temperature co-fired ceramic (LTCC) radio frequency (RF) and microwave attenuator device having at least two ports, the attenuator used to compensate the effect of temperature changes temperature changes in an electronic circuit comprising:

a substrate having a pair of major surfaces;

a plurality of thermistors embedded within the substrate, at least one of the thermistors comprising a columnar body of thermistor material extending substantially in the direction between the major surfaces; and electrodes on the major surfaces interconnecting the thermistors in groups, the groups forming the components of an attenuator connected by the electrodes to form a temperature compensating circuit, wherein at least two groups have different temperature coefficients such that the temperature coefficient of the attenuator device compensates for the changes in the electronic circuit;

at least three terminals forming the at least two ports, wherein one of the terminals comprises an input electrode connected to one group of columnar thermistors, one of the terminals comprises an output electrode connected to at least one different group of columnar thermistors, and one of the terminals comprises a common terminal.

14. The device of claim 13 wherein one group of the at least two groups has a positive temperature coefficient and a second group of the at least two groups has a negative temperature coefficient.

15. The device of claim 13 wherein the electronic circuit comprises an amplifier and the temperature coefficients of the groups of thermistors compensate for temperature induced gain changes at the amplifier.

16. The device of claim 13 wherein the electronic circuit comprises a passive electronic circuit and the temperature coefficients of the groups of thermistors compensate for changes in the passive circuit's loss with temperature.

17. The device of claim 13 wherein at least one of the thermistors comprises a plurality of parallel-interconnected columnar bodies of thermistor material, each body extending substantially in the direction between the major surfaces.

18. The device of claim 13 wherein the columnar body of thermistor material has opposite ends contacted with the electrodes at the respective major surfaces of the substrate and a lateral area embedded within the substrate, the embedded lateral area larger than the areas of the ends.

19. The device of claim 13 wherein each of a plurality of thermistors comprise a columnar body of thermistor material extending substantially in the direction between the major surfaces.

20. The device of claim 13 wherein each component of the attenuator comprises a plurality of series or parallel interconnected columnar bodies of thermistor material.

21. The device of claim 13 wherein the columnar body has its maximum dimension extending between the major surfaces.

22. The device of claim 13 wherein the columnar body has its maximum dimension extending parallel to a major surface.

23. The device of claim 13 wherein the attenuator circuit topology is selected from the group of circuit topologies consisting of π, L, bridged T, and T.

24. The device of claim 13 wherein the electrodes comprise metallization patterns.

25. The device of claim 13 wherein the electronic circuit comprises an amplifier and the temperature coefficients of the groups of thermistors compensate for temperature induced gain changes at the amplifier.

26. The device of claim 13 wherein the electronic circuit comprises a passive electronic circuit and the temperature coefficients of the groups of thermistors compensate for changes in the passive circuit's loss with temperature.

27. A low temperature co-fired ceramic (LTCC) radio frequency (RF) or microwave attenuator device having at least two ports, the attenuator used to compensate the effect of temperature changes 1 temperature changes in an electrical or electronic circuit comprising:

an LTCC substrate having a pair of major surfaces;

a plurality of thermistors embedded within the substrate, at least one of the thermistors comprising a columnar body of thermistor material extending substantially in the direction between the major surfaces; and electrodes on the major surfaces interconnecting the thermistors in groups, the groups forming the components of an attenuator in a temperature compensating circuit, wherein one or more of the electrodes are trimmable to set the value of at least one of the components;

at least three terminals forming the at least two ports, wherein one of the terminals comprises an input electrode connected to one group of columnar thermistors, one of the terminals comprises an output electrode connected to at least one different group of columnar thermistors, and one of the terminals comprises a common terminal.

28. A row temperature co-fired ceramic (LTCC) radio frequency (RF) and microwave attenuator device having at least two ports, the attenuator used to compensate the effect of temperature changes temperature changes in an electronic circuit comprising:

an LTCC substrate having a pair of major surfaces;

a plurality or thermistors embedded within the substrate, at least one of the thermistors comprising a columnar body of thermistor material extending substantially in the direction between the major surfaces; and electrodes on the major surfaces interconnecting the thermistors in groups, the groups forming the components of an attenuator connected by the electrodes to form a temperature compensating circuit, wherein at least two of the groups of thermistors comprise different temperature coefficients;

at least three terminals forming the at least two ports, wherein one of the terminals comprises an input electrode connected to one group of columnar thermistors, one of the terminals comprises an output electrode connected to at least one different group of columnar thermistors, and one of the terminals comprises a common terminal.

* * * * *